United States Patent
Forrest et al.

(10) Patent No.: US 12,501,766 B2
(45) Date of Patent: Dec. 16, 2025

(54) OPTOELECTRONIC DEVICE INCLUDING CHARGE GENERATION LAYER STACK

(71) Applicant: The Regents of the University of Michigan, Ann Arbor, MI (US)

(72) Inventors: Stephen R. Forrest, Ann Arbor, MI (US); Caleb Coburn, Ann Arbor, MI (US); Yue Qu, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 955 days.

(21) Appl. No.: 17/496,400

(22) Filed: Oct. 7, 2021

(65) Prior Publication Data

US 2022/0131100 A1 Apr. 28, 2022

Related U.S. Application Data

(60) Provisional application No. 63/105,579, filed on Oct. 26, 2020.

(51) Int. Cl.
*H10K 50/19* (2023.01)
*H10K 50/11* (2023.01)
*H10K 50/15* (2023.01)
*H10K 50/16* (2023.01)
*H10K 50/17* (2023.01)
*H10K 50/82* (2023.01)
*H10K 85/30* (2023.01)
(Continued)

(52) U.S. Cl.
CPC ............. *H10K 50/19* (2023.02); *H10K 50/11* (2023.02); *H10K 50/15* (2023.02); *H10K 50/16* (2023.02); *H10K 50/17* (2023.02); *H10K 50/82* (2023.02); *H10K 85/30* (2023.02); *H10K 85/631* (2023.02); *H10K 85/6572* (2023.02); *H10K 2101/40* (2023.02); *H10K 2102/351* (2023.02)

(58) Field of Classification Search
None
See application file for complete search history.

(56) References Cited

U.S. PATENT DOCUMENTS

| 4,769,292 | A | 9/1988 | Tang |
| 5,247,190 | A | 9/1993 | Friend |

(Continued)

FOREIGN PATENT DOCUMENTS

| EP | 1238981 | | 9/2002 | |
| EP | 3150579 | A1 * | 4/2017 | ........... C07D 213/06 |

(Continued)

OTHER PUBLICATIONS

Baldo et al., "Highly Efficient Phosphorescent Emission from Organic Electroluminescent Devices," Nature, vol. 395, pp. 151-154 (1998).

(Continued)

*Primary Examiner* — Alexander G Ghyka
(74) *Attorney, Agent, or Firm* — Riverside Law LLP

(57) ABSTRACT

An optoelectronic device comprises an anode, an emissive layer positioned over the anode, a charge generation layer stack positioned over the emissive layer, the charge generation layer stack comprising at least one hole transport layer and at least one electron transport layer positioned over the hole transport layer, and a cathode positioned over the charge generation layer stack. Other organic optoelectronic devices are also disclosed.

20 Claims, 5 Drawing Sheets

(51) Int. Cl.
 *H10K 85/60* (2023.01)
 *H10K 101/40* (2023.01)
 *H10K 102/00* (2023.01)

(56) References Cited

U.S. PATENT DOCUMENTS

| | | |
|---|---|---|
| 5,294,870 A | 3/1994 | Tang |
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 2003/0230980 A1 | 12/2003 | Forrest |
| 2004/0174116 A1 | 9/2004 | Lu |
| 2009/0121624 A1* | 5/2009 | D'Andrade .......... H10K 71/311 313/504 |
| 2011/0108825 A1* | 5/2011 | Uetani .................. H05B 33/26 438/46 |
| 2013/0026452 A1 | 1/2013 | Kottas |
| 2013/0119354 A1 | 5/2013 | Ma |
| 2017/0229663 A1 | 8/2017 | Tsai |
| 2020/0239505 A1* | 7/2020 | Li ......................... C07F 15/006 |

FOREIGN PATENT DOCUMENTS

| | | | |
|---|---|---|---|
| EP | 3480277 A1 * | 5/2019 | .......... C07D 209/86 |
| JP | 2010135467 | 6/2010 | |
| WO | 2004111066 A1 | 12/2004 | |
| WO | 2008044723 | 4/2008 | |
| WO | 2008057394 A1 | 5/2008 | |
| WO | 2010011390 A2 | 1/2010 | |
| WO | 2010111175 | 9/2010 | |
| WO | WO-2017116625 A1 * | 7/2017 | ............ H01L 51/00 |

OTHER PUBLICATIONS

Baldo et al., "Very High-Efficiency Green Organic Light-Emitting Devices Based on Electrophosphorescence," Appl. Phys. Lett., vol. 75, No. 1, pp. 4-6 (1999).

\* cited by examiner

OPTOELECTRONIC DEVICE INCLUDING CHARGE GENERATION LAYER STACK

CROSS-REFERENCE TO RELATED APPLICATIONS

This application claims priority to U.S. provisional application No. 63/105,579 filed on Oct. 26, 2020, incorporated herein by reference in its entirety.

STATEMENT REGARDING FEDERALLY SPONSORED RESEARCH OR DEVELOPMENT

This invention was made with government support under DE-EE0007077 and DE-EE0008244 awarded by the U.S. Dept. of Energy. The government has certain rights in the invention.

BACKGROUND

Optoelectronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE DISCLOSURE

In one aspect an optoelectronic device comprises an anode, an emissive layer positioned over the anode, a charge generation layer stack positioned over the emissive layer, the charge generation layer stack comprising at least one hole transport layer and at least one electron transport layer positioned over the hole transport layer, and a cathode positioned over the charge generation layer stack.

In one embodiment the charge generation layer stack has a thickness of between 100 nm and 200 nm. In one embodiment the at least one hole transport layer has a thickness of between 75 nm and 135 nm. In one embodiment the at least one hole transport layer comprises 1,1-bis((di-4-tolylamino) phenyl)cyclohexane. In one embodiment the charge generation layer stack comprises at least first and second electron transport layers. In one embodiment the second electron transport layer is positioned between the hole transport layer and the emissive layer. In one embodiment the at least one electron transport layer comprises 1,4,5,8,9,11-hexaazatriphenylene-hexacarbonitrile.

In one embodiment the at least one electron transport layer has a thickness of between 10 nm and 25 nm. In one embodiment the cathode comprises aluminum. In one embodiment the cathode comprises 8-Hydroxyquinolinolato-lithium. In one embodiment the device further comprises at least one hole injection layer between the emissive layer and the anode. In one embodiment the anode comprises ITO.

In another aspect, an organic optoelectronic device comprises an anode, a cathode, an emissive layer positioned between the anode and the cathode at a distance from the cathode of at least 200 nm, and at least one charge generation layer stack comprising at least one electron transport layer and at least one hole transport layer positioned between the emissive layer and the cathode.

In one embodiment the distance is at least 230 nm. In one embodiment the distance is between 220 nm and 250 nm. In one embodiment the at least one hole transport layer has a thickness of between 75 nm and 135 nm. In one embodiment the at least one electron transport layer comprises a first electron transport layer positioned between the cathode and the hole transport layer, and a second electron transport layer positioned between the hole transport layer and the emissive layer.

In one embodiment the at least one hole transport layer comprises 1,1-bis((di-4-tolylamino)phenyl)cyclohexane. In one embodiment the at least one electron transport layer is positioned between the cathode and the at least one hole transport layer. In one embodiment the at least one electron transport layer comprises 1,4,5,8,9,11-hexaazatriphenylene-hexacarbonitrile. In one embodiment the at least one electron transport layer has a thickness of between 10 nm and 25 nm. In one embodiment the cathode comprises aluminum. In one embodiment the cathode comprises 8-Hydroxyquinolinolato-lithium. In one embodiment the anode comprises ITO.

BRIEF DESCRIPTION OF THE DRAWINGS

The foregoing purposes and features, as well as other purposes and features, will become apparent with reference to the description and accompanying figures below, which are included to provide an understanding of the disclosure and constitute a part of the specification, in which like numerals represent like elements, and in which.

DETAILED DESCRIPTION

Figure 1:
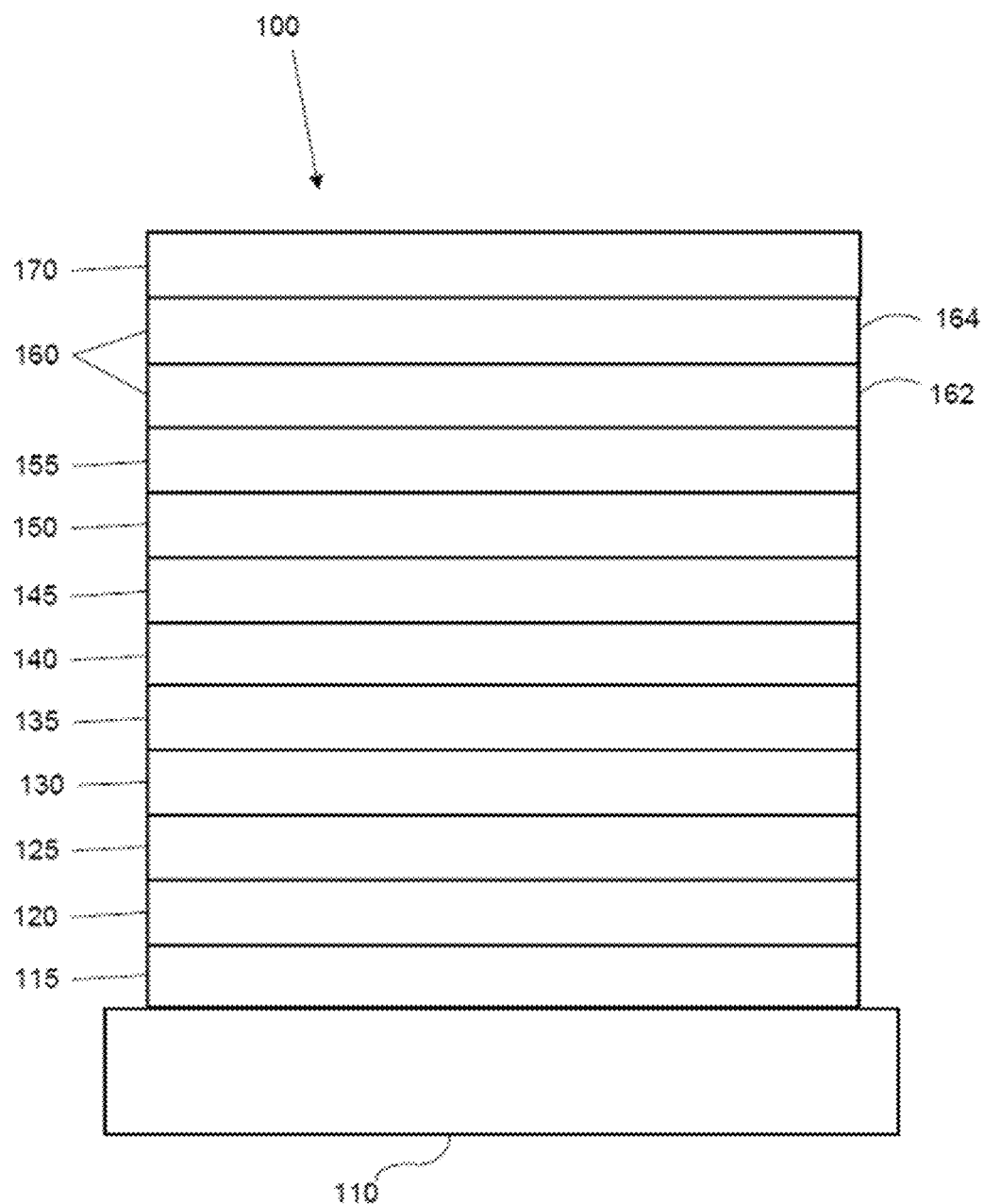
FIG. 1 shows an organic light emitting device.

It is to be understood that the figures and descriptions of the present disclosure have been simplified to illustrate elements that are relevant for a clear understanding of the present disclosure, while eliminating, for the purpose of clarity, many other elements found in related systems and methods. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the present disclosure, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects of the disclosure can be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

As used herein, and as would be understood by one skilled in the art, "HATCN" (referred to interchangeably as HAT-CN) refers to 1,4,5,8,9,11-Hexaazatriphenylenehexacarbonitrile. "TAPC" refers to 4,4'-Cyclohexylidenebis[N,N-bis(4-methylphenyl)aniline]. "B3PYWIPM" refers to 4,6-Bis(3,5-di(pyridin-3-yl)phenyl)-2-methylpyrimidine. "BPyTP2" refers to 2,7-Bis(2,2'-bipyridin-5-yl)triphenylene. "LiQ" refers to Lithium Quinolate. "ITO" refers to Indium Tin Oxide. "CBP" refers to 4,4'-Bis(N-carbazolyl)-1,1'-biphenyl. "Ir(ppy)$_2$acac" refers to bis[2-(2-pyridinyl-N)phenyl-C](acetylacetonato)iridium(III).

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
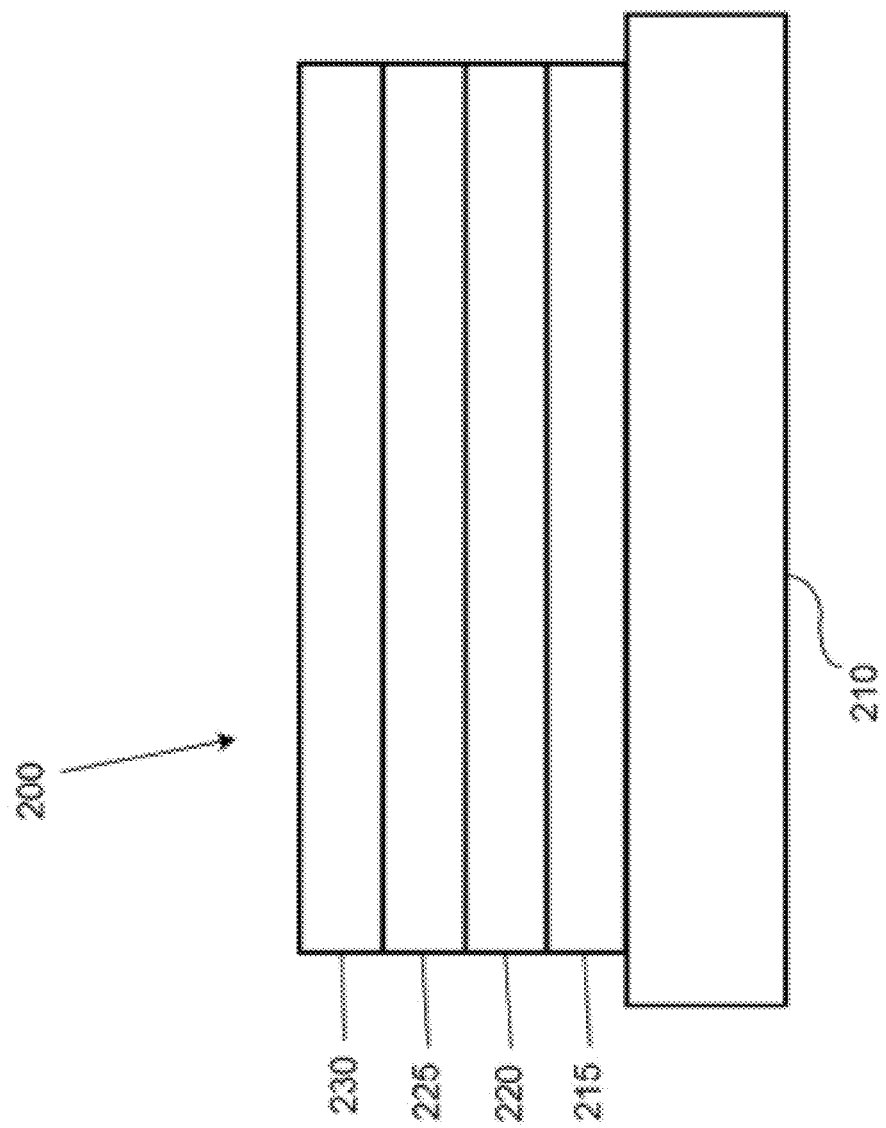
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIG. 1 and FIG. 2 is provided by way of non-limiting example, and it is understood that embodiments of the disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIG. 1 and FIG. 2.

Although certain embodiments of the disclosure are discussed in relation to one particular device or type of device (for example OLEDs) it is understood that the disclosed improvements to light outcoupling properties of a substrate may be equally applied to other devices, including but not limited to PLEDs, OPVs, charge-coupled devices (CCDs), photosensors, or the like.

Certain embodiments of the disclosure relate to a light emitting device comprising an emissive layer (EML) spaced far from a cathode as described herein. Conventional organic light emitting devices typically place the EML near a metal cathode which incurs plasmon losses due to near field coupling. To avoid exciting these lossy modes it is necessary to space the EML far from the cathode. However, utilizing a thick electron transport layer (ETL) can be problematic due to changes in charge balance and increased resistivity. These problems can be overcome by utilizing a charge generation layer, for example a charge generation layer comprising at least one electron transport layer and at least one hole transport layer, to convert electron into hole current. This allows the use of higher mobility hole transporting materials and maintains the charge balance of the device. In some embodiments, the charge generation layer may be replaced or combined with any other layer capable of conducting electrons.

Figure 3B:
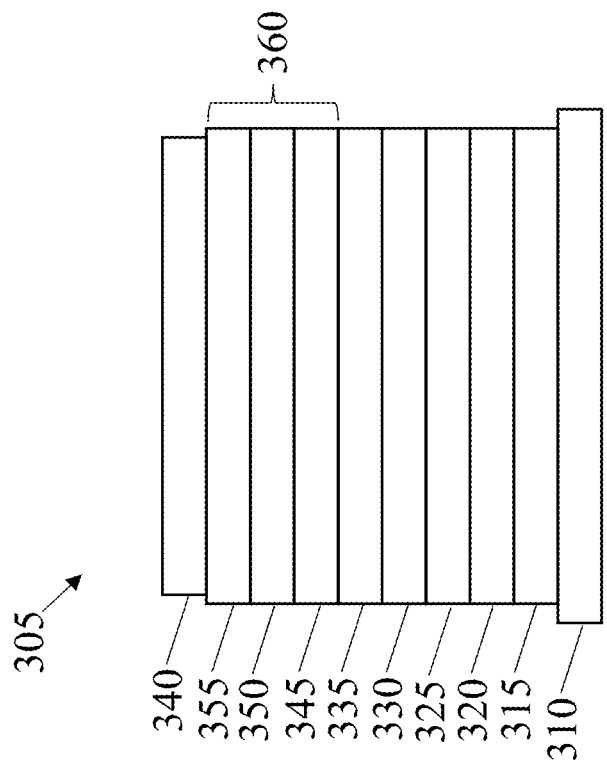
FIG. 3B shows an example organic light emitting device including a charge generation layer stack.
Figure 3A:
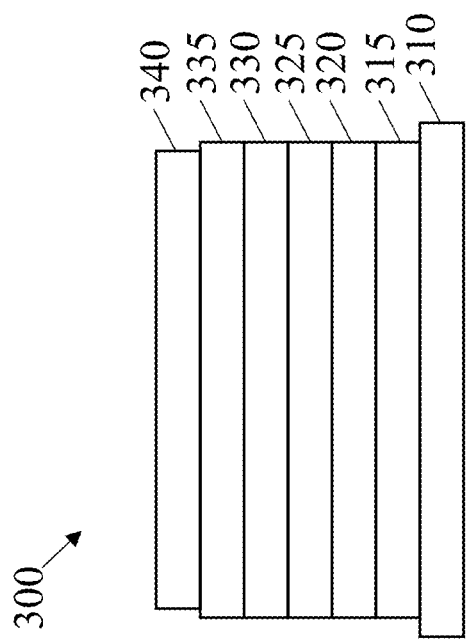
FIG. 3A shows another example of an organic light emitting device.

With reference to FIG. 3A and FIG. 3B, an example reference device 300 and a device 305 with a charge generation layer (CGL) stack 360 spacer is shown. The thickness of the CGL stack 360 may be adjusted in order to control the distance between a cathode 340 and an emissive layer (EML) 325. Both devices can be fabricated on a suitable substrate, such as glass. The example reference device 300 includes, in order from bottom to top, an anode 310, a first electron transport layer (ETL) 315, a first hole transport layer (HTL) 320, an emissive layer (EML) 325, a first hole blocking layer (HBL) 330, a second HBL 335 and a cathode 340. As used herein, the terms electron transport layer and hole blocking layer may be used interchangeably to describe a layer configured to extract and/or transport electrons, for example to minimize charge recombination.

Similarly, the example disclosed device 305 includes, in order from bottom to top, an anode 310, a first ETL 315, a first HTL 320, an EML 325, a first HBL 330, a second HBL 335 and a cathode 340. Additionally, positioned between the second HBL 335 and the cathode 340 is a second ETL 345, a second HTL 350, and a third ETL 355. The second ETL 345, second HTL 350 and third ETL make up the CGL stack 360. The CGL stack 360 provides for spacing between the EML 325 and the cathode 340 but without the drawbacks of a change in charge balance and increased resistivity that a thick ETL would provide. The CGL stack 360 converts electron into hole current, allowing for the use of higher mobility hole transporting materials without the drawbacks of a thick ETL.

By way of an example, for both the reference device 300 and the device 305 the anode 310 can be ITO with a thickness of 150 nm, the first ETL 315 can be HATCN with a thickness of 2 nm, and the first HTL 320 can be TAPC with a thickness of 40 nm. The EML 325 can be 8 vol % Ir(ppy)$_2$acac:CBP with a thickness of 25 nm, the first HBL 330 can be B3PYMPM with a thickness of 50 nm, the second HBL 335 can be Li:BPyTP2 1:1 molar with a thickness of 15 nm, and the cathode 340 can be 1.5 nm LiQ and 100 nm Al. Additionally, for the device 305, the second ETL 345 can be HATCN with a thickness of 15 nm, the second HTL 350 can be TAPC with a thickness ranging from 75-135 nm, and the third ETL can be HATCN with a thickness of 20 nm. In one embodiment the second HTL 350 can be TAPC with a thickness ranging from 75-135 nm, for example in 12 nm steps. In one embodiment, the second HTL 350 may have a thickness between 10 nm and 200 nm, or between 10 nm and 150 nm, or between 20 nm and 150 nm, or between 40 nm and 150 nm, or between 50 nm and 150 nm, or between 60 nm and 140 nm. The above details are purely meant as an example, and other materials, thicknesses, structuring and layer ordering can be utilized as known in the art.

Although the depicted example shows an ITO anode 310 having a thickness of 150 nm, it is understood that any suitable thickness may be used, including but not limited to 10-500 nm, 30-300 nm, 50-250 nm, 100-200 nm, 130-170 nm, about 150 nm, or any other suitable thickness. Additionally, although the example describes the anode 310 as ITO, it is understood that any suitable material, including any conductive transparent, semi-transparent, or opaque material or combinations of materials may be used.

Although the depicted example shows a HATCN first ETL 315 having a thickness of 2 nm, it is understood that any suitable thickness may be used, including but not limited to 2-20 nm, 2-15 nm, 2-10 nm, 2-5 nm, about 2 nm, or any other suitable thickness. Additionally, although the example describes the first ETL 315 as HATCN, it is understood that any suitable material may be used. A list of exemplary ETL materials may be found in U.S. Pat. No. 5,294,870, issued Mar. 15, 1994, incorporated herein by reference. In some embodiments, any other suitable materials or combinations thereof may be used.

Although the depicted example shows a TAPC first HTL 320 having a thickness of 40 nm, it is understood that any suitable thickness may be used, including but not limited to 2-200 nm, 5-150 nm, 10-75 nm, 35-45 nm, about 40 nm, or any other suitable thickness. Additionally, although the example describes the first HTL 320 as TAPC, it is understood that any suitable material may be used. A list of exemplary HTL materials may be found in U.S. Pat. No. 5,294,870, issued Mar. 15, 1994, incorporated herein by reference. In some embodiments, any other suitable materials or combinations thereof may be used.

Although the depicted example shows an 8 vol % Ir(ppy)$_2$acac:CBP EML 325 having a thickness of 25 nm, it is understood that any suitable thickness may be used, including but not limited to 2-200 nm, 5-150 nm, 10-75 nm, 15-50 nm, 20-30 nm, about 25 nm, or any other suitable thickness. Additionally, although the example describes the EML 325 as 8 vol % Ir(ppy)$_2$acac:CBP, it is understood that any suitable material and ratio may be used.

Although the depicted example shows a B3PYMPM first HBL 330 having a thickness of 50 nm, it is understood that any suitable thickness may be used, including but not limited to 2-200 nm, 10-120 nm, 25-75 nm, 40-60 nm, about 50 nm, or any other suitable thickness. Additionally, although the example describes the first HBL 330 as B3PYMPM, it is understood that any suitable material may be used. A list of exemplary HBL materials may be found in U.S. Pat. No. 5,294,870, issued Mar. 15, 1994, incorporated herein by reference. In some embodiments, any other suitable materials or combinations thereof may be used.

Although the depicted example shows Li:BPyTP2 1:1 molar second HBL 335 having a thickness of 15 nm, it is understood that any suitable thickness may be used, including but not limited to 2-200 nm, 5-50 nm, 10-20 nm, about 15 nm, or any other suitable thickness. Additionally, although the example describes the second HBL 335 as Li:BPyTP2 1:1 molar, it is understood that any suitable material and ratio may be used, or combinations thereof.

Although the depicted example shows a HATCN second ETL 345 having a thickness of 15 nm, it is understood that any suitable thickness may be used, including but not limited to 2-200 nm, 5-100 nm, 10-20 nm, about 15 nm, or any other suitable thickness. Additionally, although the example describes the second ETL 345 as HATCN, it is understood that any suitable material may be used, or combinations thereof.

Although the depicted example shows a TAPC second HTL 350 having a thickness of 75-135 nm, it is understood that any suitable thickness may be used, including but not limited to 2-300 nm, 25-200 nm, 50-150 nm, about 100 nm, or any other suitable thickness. Additionally, although the example describes the second HTL 350 as TAPC, it is understood that any suitable material may be used, or combinations thereof.

Although the depicted example shows a HATCN third ETL 355 having a thickness of 20 nm, it is understood that any suitable thickness may be used, including but not limited to 2-200 nm, 5-120 nm, 10-75 nm, about 20 nm, or any other suitable thickness. Additionally, although the example describes the third ETL 355 as HATCN, it is understood that any suitable material may be used, or combinations thereof.

Although the depicted example shows a cathode 340 comprising a 1.5 nm thick LiQ layer and a 100 nm Al layer, it is understood that any suitable thicknesses may be used, including but not limited to 2-200 nm/2-200 nm, 2-5 nm/50-150 nm, 2-3 nm/75-125 nm, about 2 nm/100 nm, or any other suitable thicknesses. Additionally, although the example describes the cathode 340 as LiQ/Al, it is understood that any suitable material, ratio and combination may be used.

In one embodiment, the light emitting layer includes a stack of light emitting sublayers. In another embodiment, the light emitting layer includes light emitting sublayers that are arranged in a horizontally adjacent pattern, e.g., to from adjacent sub-pixels or an electronic display. For example, the light emitting body can includes separate red and green light emitting sublayers in a stacked or side-by-side (i.e., adjacent) arrangement.

The EML 325 can include one or more phosphorescent emitter compounds doped into a host material, wherein the phosphorescent emitter compound has a peak light emission wavelength in a range from 300 nm to 2500 nm. In some embodiments, multiple emissive layers or compounds may be used to produce light having more than one peak emission wavelength. In some embodiments, a peak emission wavelength may be in the range of UV-A (300-380 nm), Violet (380-430 nm), Blue (430-500 nm), Cyan (500-520 nm), Green (520-565 nm), Yellow (565-580 nm), Orange (580-625 nm), Red (625-740 nm), near IR (740-1400 nm) or Far IR (1400-2500 nm). In some instances, the light emitting layer can also include a fluorescent emitter compound or a thermal-assisted delayed fluorescence (TADF) emitter compound. For example, the EML 325 can include fluorescent or TADF compound with a peak light emission wavelength in a range from 430 nm to 500 nm.

In one embodiment, the electronic light display is a white-light organic electroluminescent device (WOLED).

Devices of the present disclosure may comprise one or more electrodes, some of which may be fully or partially transparent or translucent. In some embodiments, one or more electrodes comprise indium tin oxide (ITO) or other transparent conductive materials. In some embodiments, one or more electrodes may comprise flexible transparent and/or conductive polymers.

Layers may include one or more electrodes, organic emissive layers, electron- or hole-blocking layers, electron- or hole-transport layers, buffer layers, or any other suitable layers known in the art. In some embodiments, one or more of the electrode layers may comprise a transparent flexible material. In some embodiments, both electrodes may comprise a flexible material and one electrode may comprise a transparent flexible material.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIG. 1 and FIG. 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In general, the various layers of OLEDs and similar devices described herein may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Some OLED structures and similar devices may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials, structures, and techniques described herein may have applications in devices other than the fabrication of OLEDs. For example, other optoelectronic devices such as organic solar cells and organic photodetectors may employ the materials and structures. More generally, organic devices, such as organic transistors, may employ the materials and structures.

An OLED fabricated using devices and techniques disclosed herein may have one or more characteristics selected from the group consisting of being flexible, being rollable, being foldable, being stretchable, and being curved, and may be transparent or semi-transparent. In some embodiments, the OLED further comprises a layer comprising carbon nanotubes.

In some embodiments, an OLED fabricated using devices and techniques disclosed herein further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

An OLED fabricated according to techniques and devices disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL

A hole injecting/transporting material to be used in the present disclosure is not particularly limited, and any compound may be used as long as the compound is typically used as a hole injecting/transporting material.

EBL

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

The CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, OLEDs and other similar devices may be fabricated using a variety of techniques and devices. For example, in OVJP and similar techniques, one or more jets of material is directed at a substrate to form the various layers of the OLED.

EXPERIMENTAL EXAMPLES

The disclosure is further described in detail by reference to the following experimental examples. These examples are provided for purposes of illustration only, and are not intended to be limiting unless otherwise specified. Thus, the disclosure should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present disclosure. The following working examples therefore, specifically point out the exemplary embodiments of the present disclosure, and are not to be construed as limiting in any way the remainder of the disclosure.

Device Fabrication and Measurements

The example reference device 300 and device 305 of FIG. 3A and FIG. 3B, respectively, were fabricated and various experimental measurements were performed.

Results

Figure 4A:
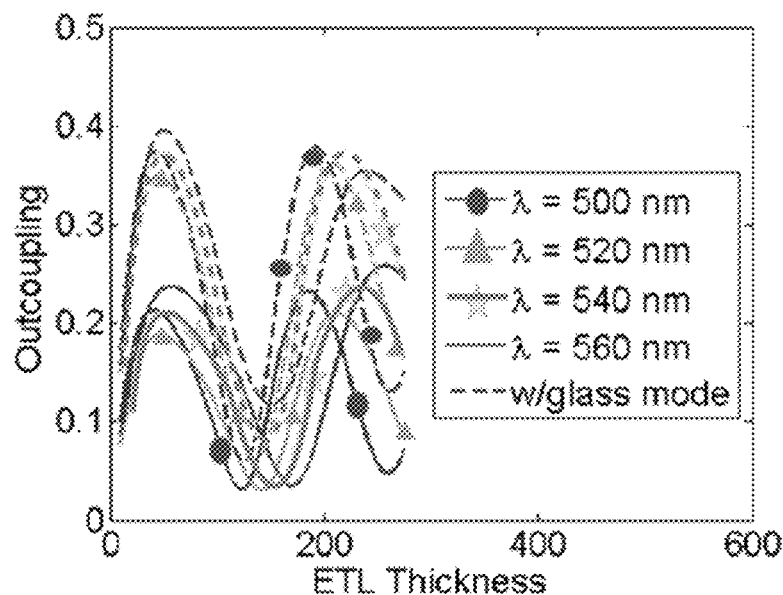
FIG. 4A shows the calculated outcouple vs wavelength and ETL thickness of the device of FIG. 3B.

FIG. 4A shows the calculated outcouple vs ETL thickness of the device 305 of FIG. 3B for various wavelengths where the ETL thickness is the distance between the cathode 340 and the EML 325. The outcoupling is the ratio of light escaping the device 305 compared to the total light created by the device 305.

The figure also shows a comparison between glass and non-glass mode varieties of the device 305, where the glass mode provides high outcoupling for the various wavelengths shown. As shown in the figure, the device 305 with an ETL thickness of 175-235 nm provides similar outcoupling to the example reference device 300 with an ETL thickness of 65 nm. In the depicted embodiment, the substrate is glass, but it is understood that other materials could be used in a substrate, including but not limited to plastics or other materials. In some embodiments, the substrate may include or be configured to be used with a microlens array.

Figure 4B:
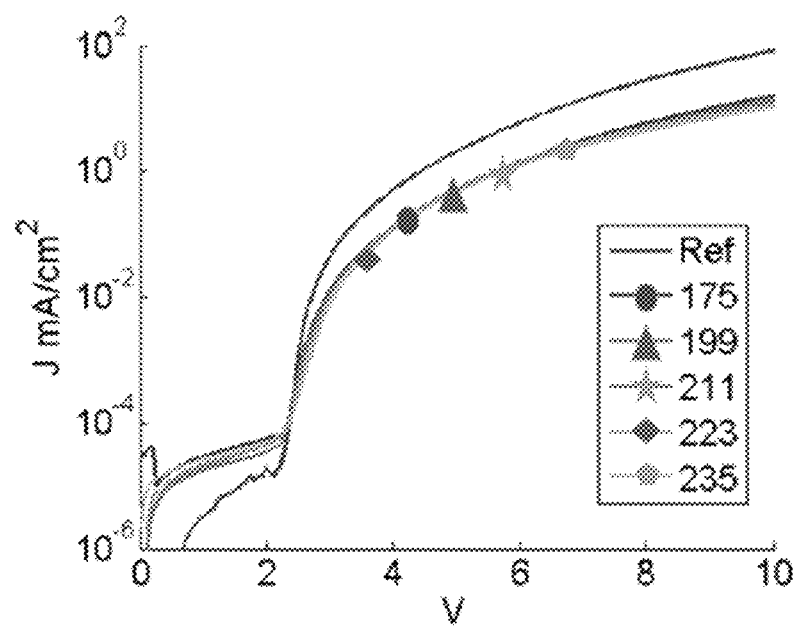
FIG. 4B shows the current density-voltage characteristics of the devices of FIG. 3A and FIG. 3B.

FIG. 4B shows the current density-voltage characteristics of the reference device 300 and for device 305 for various ETL distances. The ETL distances are the distance between the Al cathode 340 and the EML 325 in nm. The voltage is increased for the device 305 with the CGL 360 spacer, however the voltage increase is nearly independent of the spacer thickness. Further optimization can reduce or eliminate the voltage increase.

Figure 5A:
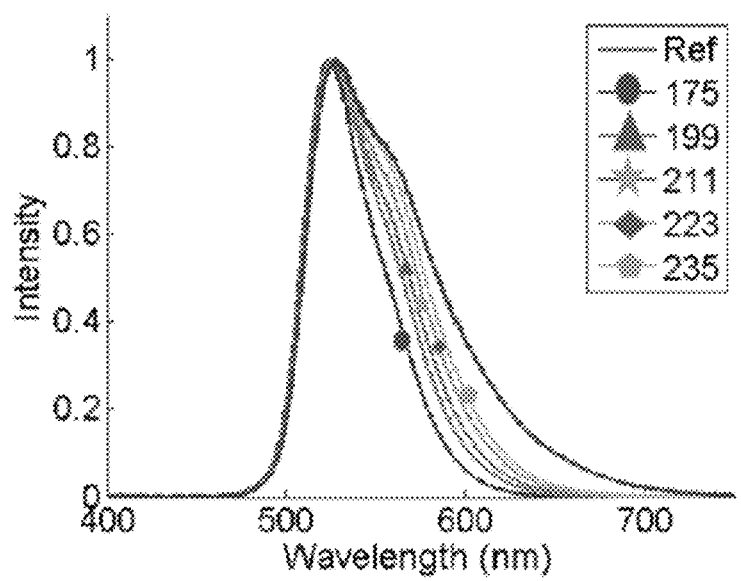
FIG. 5A is an electroluminescence (EL) spectrum of the devices of FIG. 3A and FIG. 3B.

FIG. 5A is an electroluminescence (EL) spectrum of the devices 300 and 305 for various ETL distances. The ETL distances are the distance between the Al cathode 340 and the EML 325 in nm. Each OLED has a spectral peak at $\lambda \approx 530$ nm. The spectra of the CGL spacer devices 305 are narrower than the example reference device 300.

Figure 5B:
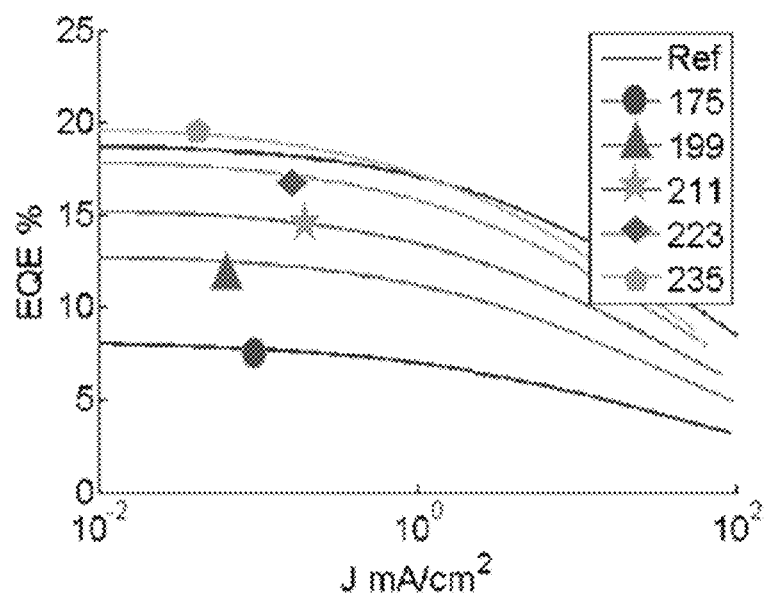
FIG. 5B plots the external quantum efficiencies of the devices of FIG. 3A and FIG. 3B.

FIG. 5B plots the external quantum efficiencies (EQE) of the devices 300 and 305 for various ETL distances. The ETL distances are the distance between the Al cathode 340 and the EML 325 in nm. As shown, the maximum EQE of the device 305 including the CGL spacer 360 exceeds that of the example reference device 300 for some CGL distance values. Furthermore, the similar shapes of the EQE characteristics indicate that the charge balance of the device is largely unchanged.

The disclosures of each and every patent, patent application, and publication cited herein are hereby incorporated herein by reference in their entirety. While devices and methods have been disclosed with reference to specific embodiments, it is apparent that other embodiments and variations of this disclosure may be devised by others skilled in the art without departing from the true spirit and scope of the disclosure. The appended claims are intended to be construed to include all such embodiments and equivalent variations.

The invention claimed is:

1. An organic optoelectronic device, comprising:
   an anode;
   a single emissive layer positioned over the anode;
   a charge generation layer stack spacer positioned over the emissive layer, the charge generation layer stack spacer comprising at least one hole transport layer and at least one electron transport layer positioned over the hole transport layer; and
   a cathode positioned over the charge generation layer stack spacer.

2. The organic optoelectronic device of claim 1, wherein the charge generation layer stack spacer has a thickness of between 100 nm and 200 nm.

3. The organic optoelectronic device of claim 1, wherein the at least one hole transport layer has a thickness of between 75 nm and 135 nm.

4. The organic optoelectronic device of claim 1, wherein the at least one hole transport layer comprises 1,1-bis((di-4-tolylamino)phenyl)cyclohexane.

5. The organic optoelectronic device of claim 1, wherein the charge generation layer stack spacer comprises at least first and second electron transport layers.

6. The organic optoelectronic device of claim 5, wherein the second electron transport layer is positioned between the hole transport layer and the emissive layer.

7. The organic optoelectronic device of claim 5, wherein the at least one electron transport layer comprises 1,4,5,8,9,11-hexaazatriphenylene-hexacarbonitrile.

8. The organic optoelectronic device of claim 5, wherein the at least one electron transport layer has a thickness of between 10 nm and 25 nm.

9. The organic optoelectronic device of claim 1, further comprising at least one hole injection layer between the emissive layer and the anode.

10. An organic optoelectronic device, comprising:
an anode;
a cathode;
a single emissive layer positioned between the anode and the cathode at a distance from the cathode of at least 200 nm; and
at least one charge generation layer stack spacer comprising at least one electron transport layer and at least one hole transport layer positioned between the emissive layer and the cathode.

11. The organic optoelectronic device of claim 10, wherein the distance is at least 230 nm.

12. The organic optoelectronic device of claim 10, wherein the distance is between 220 nm and 250 nm.

13. The organic optoelectronic device of claim 10, wherein the at least one hole transport layer has a thickness of between 75 nm and 135 nm.

14. The organic optoelectronic device of claim 10, wherein the at least one electron transport layer comprises a first electron transport layer positioned between the cathode and the hole transport layer, and a second electron transport layer positioned between the hole transport layer and the emissive layer.

15. The organic optoelectronic device of claim 10, wherein the at least one hole transport layer comprises 1,1-bis((di-4-tolylamino)phenyl)cyclohexane.

16. The organic optoelectronic device of claim 10, wherein the at least one electron transport layer is positioned between the cathode and the at least one hole transport layer.

17. The organic optoelectronic device of claim 10, wherein the at least one electron transport layer comprises 1,4,5,8,9,11-hexaazatriphenylene-hexacarbonitrile.

18. The organic optoelectronic device of claim 10, wherein the at least one electron transport layer has a thickness of between 10 nm and 25 nm.

19. The organic optoelectronic device of claim 1, wherein the charge generation layer stack spacer is in direct contact with the cathode.

20. The organic optoelectronic device of claim 10, wherein the charge generation layer stack spacer is in direct contact with the cathode.

* * * * *